US012671168B2

(12) United States Patent
Chuang et al.

(10) Patent No.: US 12,671,168 B2
(45) Date of Patent: Jun. 30, 2026

(54) HETEROGENEOUS ANTENNA IN FAN-OUT PACKAGE

(71) Applicant: Taiwan Semiconductor Manufacturing Co., Ltd., Hsinchu (TW)

(72) Inventors: Po-Yao Chuang, Hsinchu (TW); Po-Hao Tsai, Taoyuan (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 54 days.

(21) Appl. No.: 18/647,106

(22) Filed: Apr. 26, 2024

(65) Prior Publication Data

US 2024/0297432 A1     Sep. 5, 2024

Related U.S. Application Data

(63) Continuation of application No. 18/064,594, filed on Dec. 12, 2022, now Pat. No. 11,996,606, which is a
(Continued)

(51) Int. Cl.
H01Q 1/22          (2006.01)
H01Q 9/04          (2006.01)
(Continued)

(52) U.S. Cl.
CPC ......... H01Q 1/2283 (2013.01); H01Q 9/0407 (2013.01); H01Q 19/10 (2013.01);
(Continued)

(58) Field of Classification Search
CPC ........ H01Q 1/2283; H01Q 1/243; H01Q 1/38; H01Q 9/0407; H01Q 9/0414; H01Q 19/10;
(Continued)

(56) References Cited

U.S. PATENT DOCUMENTS 7,444,734 B2   11/2008   Gaucher et al.
9,583,811 B2    2/2017   Seler et al.
(Continued)

FOREIGN PATENT DOCUMENTS

CN          104701304 A       6/2015
CN          108878395 A      11/2018

OTHER PUBLICATIONS

Zhang et al., "A Low-Cost and High-Gain 60-GHz Differential Phased Array Antenna in PCB Process," IEEE Transactions on Components, Packaging and Manufacturing Technology, vol. 8, No. 7, Jul. 2018, pp. 1281-1291.

*Primary Examiner* — Seokjin Kim
(74) *Attorney, Agent, or Firm* — Slater Matsil, LLP

(57)          ABSTRACT

A method includes bonding an antenna substrate to a redistribution structure. The antenna substrate has a first part of a first antenna, and the redistribution structure has a second part of the first antenna. The method further includes encapsulating the antenna substrate in an encapsulant, and bonding a package component to the redistribution structure. The redistribution structure includes a third part of a second antenna, and the package component includes a fourth part of the second antenna.

20 Claims, 22 Drawing Sheets

Related U.S. Application Data continuation of application No. 16/559,143, filed on Sep. 3, 2019, now Pat. No. 11,532,867.

(60) Provisional application No. 62/785,782, filed on Dec. 28, 2018.

(51) Int. Cl.

| | |
|---|---|
| *H01Q 19/10* | (2006.01) |
| *H10W 44/20* | (2026.01) |
| *H10W 70/05* | (2026.01) |
| *H10W 70/60* | (2026.01) |
| *H10W 70/65* | (2026.01) |
| *H10W 70/685* | (2026.01) |
| *H10W 74/01* | (2026.01) |
| *H10W 74/10* | (2026.01) |
| *H10W 90/00* | (2026.01) |
| *H10D 84/01* | (2025.01) |
| *H10P 72/70* | (2026.01) |
| *H10W 72/00* | (2026.01) |

(52) U.S. Cl.
   CPC ........... *H10W 44/20* (2026.01); *H10W 70/05* (2026.01); *H10W 70/093* (2026.01); *H10W 70/095* (2026.01); *H10W 70/611* (2026.01); *H10W 70/65* (2026.01); *H10W 70/685* (2026.01); *H10W 74/016* (2026.01); *H10W 74/117* (2026.01); *H10W 90/401* (2026.01); *H10D 84/01* (2025.01); *H10P 72/74* (2026.01); *H10P 72/7424* (2026.01); *H10P 72/743* (2026.01); *H10P 72/7436* (2026.01); *H10W 44/209* (2026.01); *H10W 44/248* (2026.01); *H10W 72/0198* (2026.01); *H10W 72/072* (2026.01); *H10W 72/07207* (2026.01); *H10W 72/073* (2026.01); *H10W 72/07307* (2026.01); *H10W 72/877* (2026.01); *H10W 74/014* (2026.01); *H10W 74/019* (2026.01); *H10W 90/00* (2026.01); *H10W 90/724* (2026.01); *H10W 90/734* (2026.01)

(58) Field of Classification Search
   CPC ...... H01Q 5/307; H01Q 21/28; H01Q 21/065; H10W 44/20
   See application file for complete search history.

(56) References Cited

U.S. PATENT DOCUMENTS

| | | | | |
|---|---|---|---|---|
| 9,608,334 | B2 | 3/2017 | Spella | |
| 9,991,216 | B2 | 6/2018 | Liao et al. | |
| 10,319,688 | B2 | 6/2019 | Wolter et al. | |
| 10,797,375 | B2 * | 10/2020 | Ndip | H01L 23/552 |
| 10,978,778 | B2 * | 4/2021 | Ndip | H01L 23/5389 |
| 11,271,313 | B2 * | 3/2022 | Tung | H01Q 9/0414 |
| 2014/0117515 | A1 | 5/2014 | Lachner et al. | |
| 2015/0016078 | A1 | 1/2015 | Yang et al. | |
| 2016/0104940 | A1 * | 4/2016 | Wang | H01Q 21/065 |
| | | | | 343/834 |
| 2017/0278808 | A1 | 9/2017 | Lioa et al. | |
| 2017/0345731 | A1 * | 11/2017 | Chiang | H01L 23/3128 |
| 2017/0346185 | A1 | 11/2017 | Wang et al. | |
| 2018/0083341 | A1 * | 3/2018 | Yen | H01Q 1/2283 |
| 2018/0102595 | A1 | 4/2018 | Wang et al. | |
| 2018/0191053 | A1 | 7/2018 | Ndip et al. | |
| 2018/0205134 | A1 | 7/2018 | Khan et al. | |
| 2018/0331027 | A1 | 11/2018 | Chen et al. | |
| 2019/0280368 | A1 * | 9/2019 | Khan | H01L 23/3128 |
| 2019/0319337 | A1 * | 10/2019 | Yen | H01Q 1/2283 |
| 2019/0348747 | A1 * | 11/2019 | Liu | H01L 23/66 |
| 2019/0348748 | A1 * | 11/2019 | Liu | H01L 23/66 |
| 2019/0348756 | A1 * | 11/2019 | Liu | H01Q 1/38 |
| 2020/0013735 | A1 * | 1/2020 | Liu | H01Q 1/2283 |
| 2020/0018515 | A1 | 1/2020 | Awasthi et al. | |
| 2020/0135654 | A1 * | 4/2020 | Lee | H01L 23/49816 |
| 2020/0185815 | A1 * | 6/2020 | Lee | H01L 23/5389 |
| 2020/0357757 | A1 | 11/2020 | Kim et al. | |
| 2020/0411948 | A1 * | 12/2020 | Lin | H01Q 1/2283 |
| 2022/0059926 | A1 * | 2/2022 | So | H01L 23/66 |
| 2025/0015483 | A1 * | 1/2025 | Wu | H01Q 1/2283 |

* cited by examiner

HETEROGENEOUS ANTENNA IN FAN-OUT PACKAGE

PRIORITY CLAIM AND CROSS-REFERENCE

This application is a continuation of U.S. patent application Ser. No. 18/064,594, filed Dec. 12, 2022 and entitled "Heterogeneous Antenna in Fan-Out Package," which is a continuation of U.S. patent application Ser. No. 16/559,143, filed Sep. 3, 2019, and entitled "Heterogeneous Antenna in Fan-Out Package," now U.S. Pat. No. 11,532,867, issued Dec. 20, 2022, which claims the benefit of U.S. Provisional Application No. 62/785,782, filed on Dec. 28, 2018, and entitled "Heterogeneous Antenna in Fan-Out Package," which applications are hereby incorporated herein by reference.

BACKGROUND

Built-in antennas are widely used in mobile applications such as cell phones. Conventionally, antennas may be formed to have some portions in redistribution lines, and other portions in printed circuit board. This scheme posts a problem for multi-band applications since the bandwidth of the resulting antenna, which is associated with the distance between the printed circuit board and the redistribution line, is fixed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
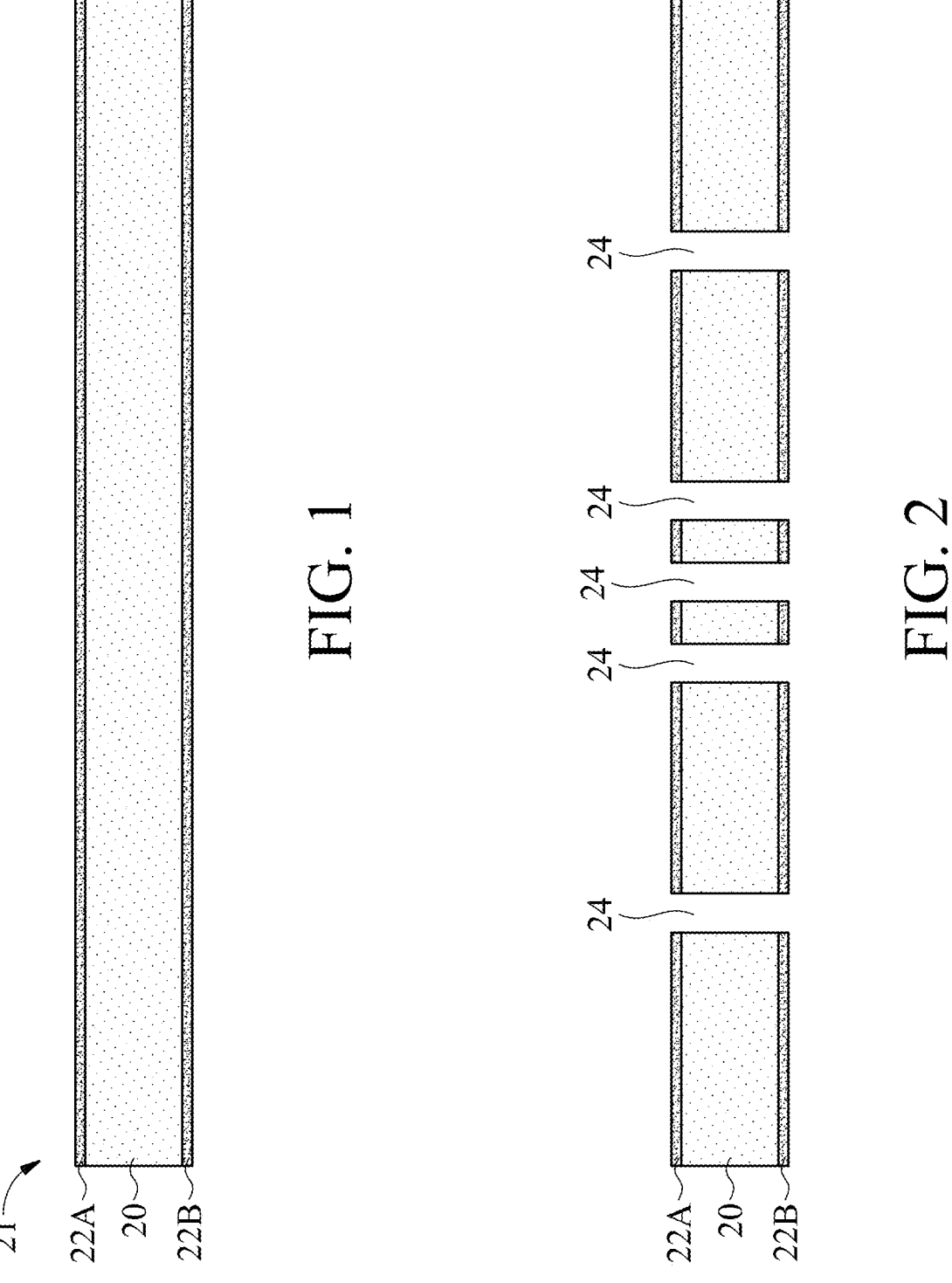
FIGS. 1 through 6 illustrate the cross-sectional views of intermediate stages in the formation of an antenna substrate including some portions of Radio Frequency (RF) antennas in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including multi-band built-in antennas and the method of forming the same are provided in accordance with some embodiments. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, a fan-out package is formed by bonding a Radio-Frequency Integrated Circuit (RFIC) die to a redistribution structure. An antenna substrate and a package component (such as a printed circuit board) may be bonded to opposite sides of the redistribution structure. The components of the antennas may be distributed in the antenna substrate, the redistribution structure, and the package component. A first distance (between the antenna substrate and the redistribution structure) and a second distance (between the package component and the redistribution structure) may be selected to have different values as desired. Accordingly, by selectively distributing the components of the multi-band antennas in the antenna substrate, the redistribution structure, and the package component, the bandwidths of the multi-band antennas may be customized.

Figure 23:
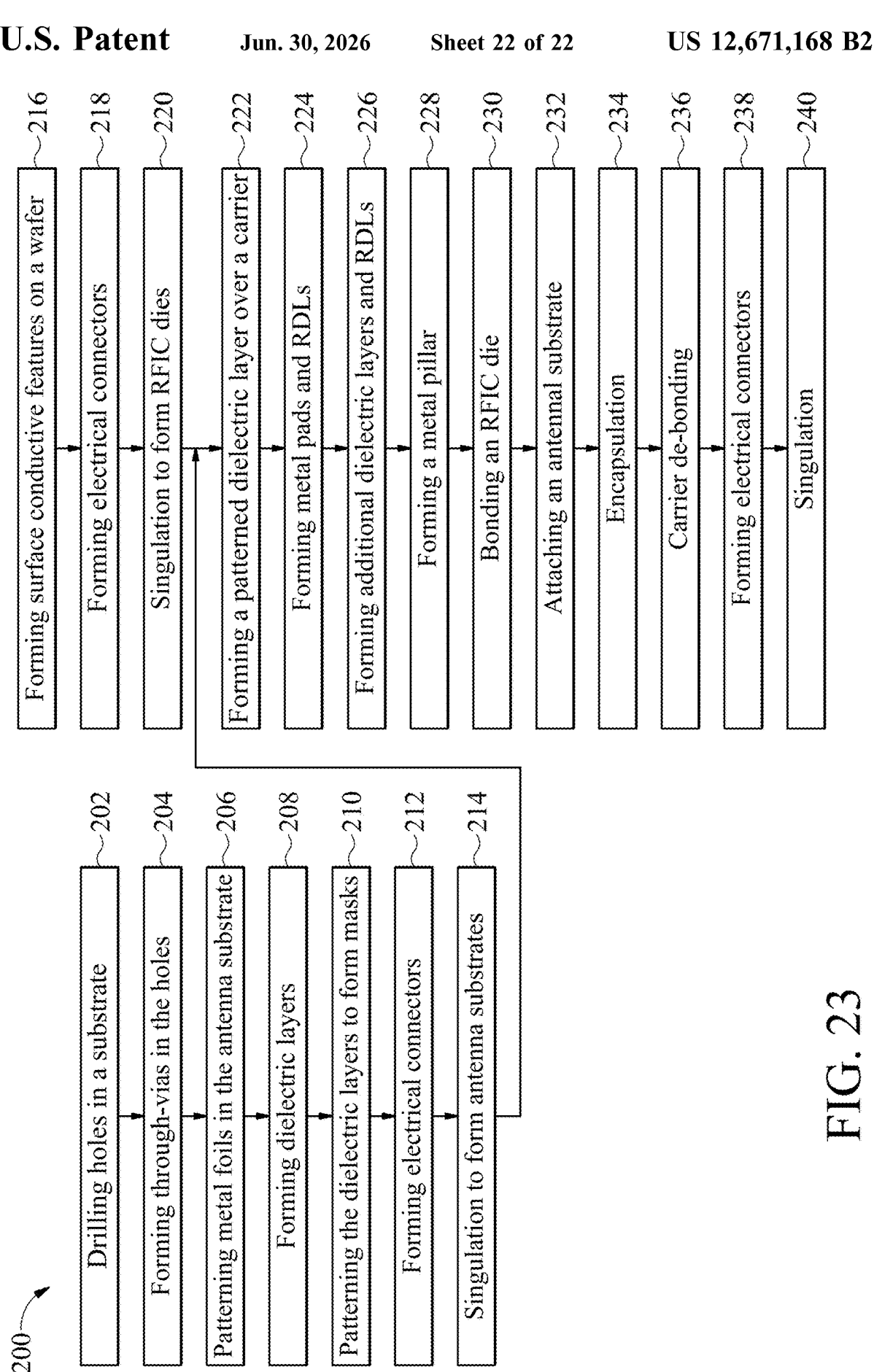
FIG. 23 illustrates a process flow for forming a package including RF antennas in accordance with some embodiments.

FIGS. 1 through 6 illustrate the cross-sectional views of intermediate stages in the formation of an antenna substrate in accordance with some embodiments of the present disclosure, in which some parts of the multi-band antennas are formed. The corresponding processes are reflected schematically in the process flow 200 shown in FIG. 23.

Referring to FIG. 1, a blanket substrate is provided. The blanket substrate 21 includes dielectric core 20, and blanket metal foils 22A and 22B on the opposite sides of dielectric core 20. In accordance with some embodiments, dielectric core 20 is formed of or includes epoxy, resin, prepreg (which comprises epoxy, resin, and/or fiber glass), resin coated Copper (RCC), glass, molding compound, plastic (such as PolyVinylChloride (PVC), Acrylonitril, Butadiene & Styrene (ABS), Polypropylene (PP), Polyethylene (PE), Poly- Styrene (PS), Polymethyl Methacrylate (PMMA), Polyethylene Terephthalate (PET), Polycarbonates (PC), Polyphenylene sulfide (PPS), flex (polyimide), ABF (Ajinomoto build-up film), BT resin, BCB (Benzocyclobutene), ceramic, PTFE (Polytetrafluoroethylene, or Teflon™), combinations thereof, and multi-layers thereof. Dielectric core 20 may also be formed of some other materials such as silicon. Metal foils 22A and 22B may be formed of copper or other electrically conductive materials. The thickness of dielectric core 20 may be in the range between about 200 μm and about 600 μm.

Referring to FIG. 2, through-openings 24 may be formed, for example, through laser drilling. The respective process is illustrated as process 202 in the process flow 200 shown in FIG. 23. Through-openings 24 penetrate through both of metal foils 22A and 22B and dielectric core 20.

Figure 3:
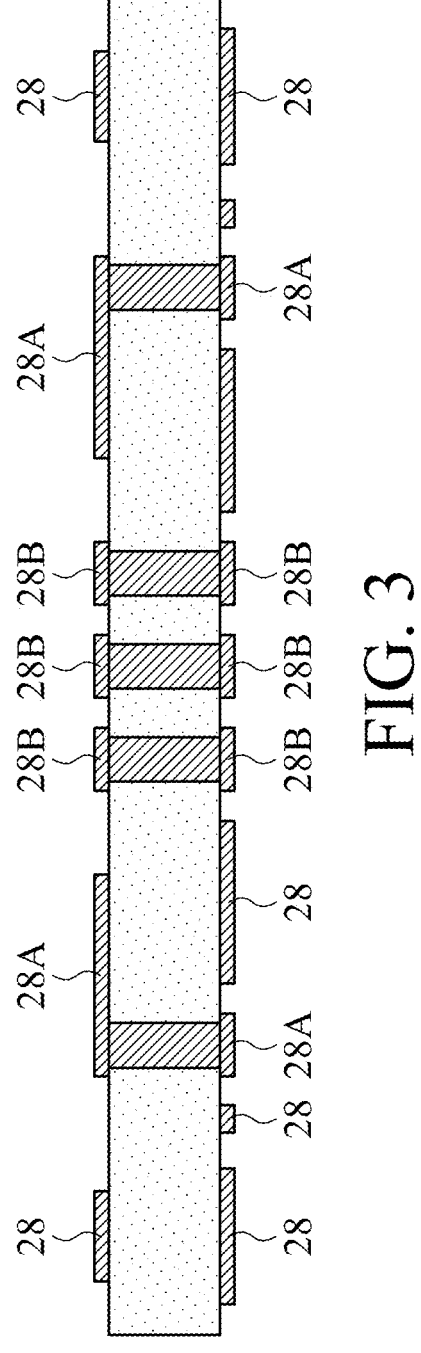
Figure 19:
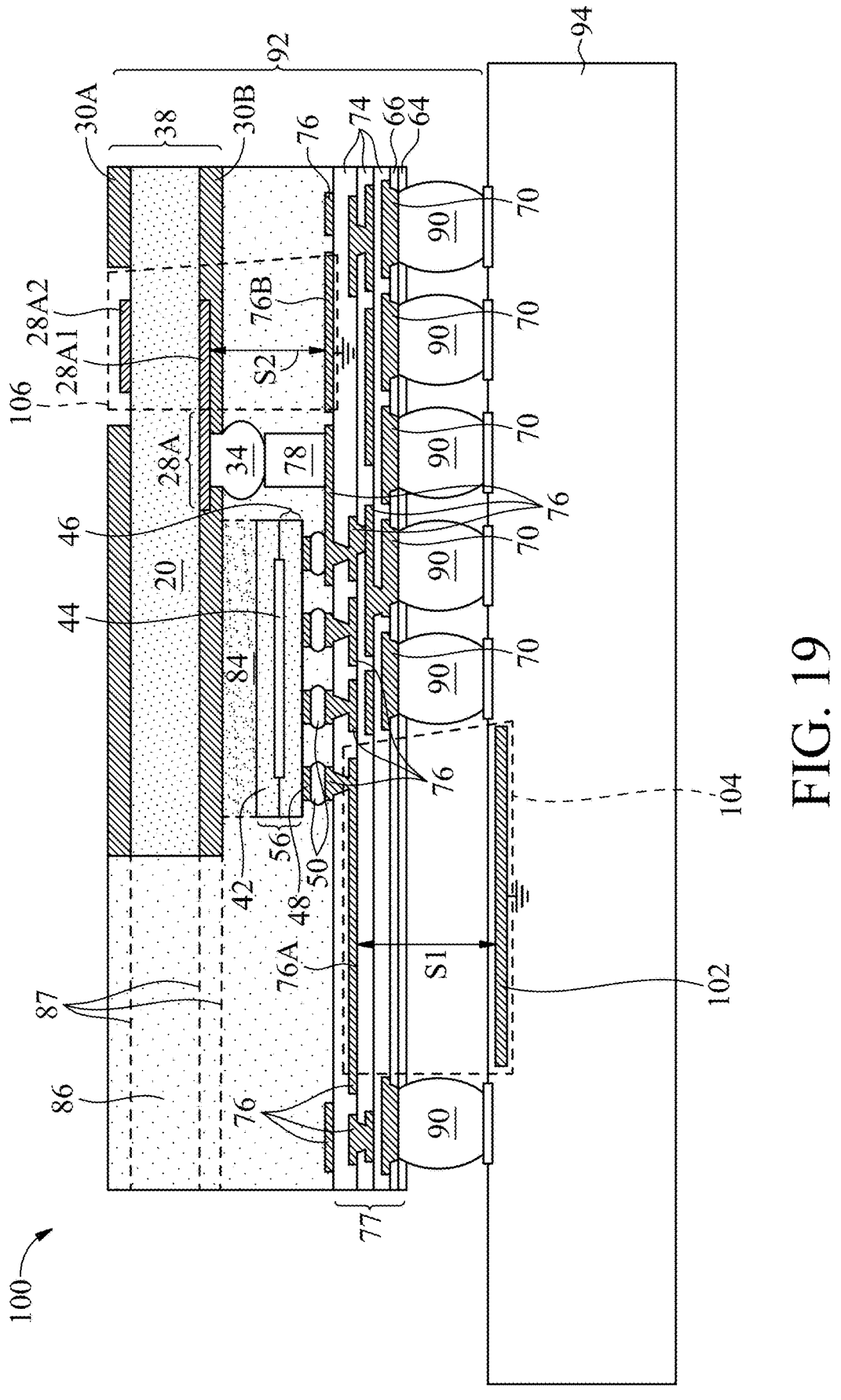

Next, referring to FIG. 3, through-openings 24 are filled with a conductive material through a plating process, forming through-vias 26 (including 26A and 26B) therein. The respective process is illustrated as process 204 in the process flow 200 shown in FIG. 23. Through-vias 26 may be formed of a metallic material such as copper, tungsten, aluminum, titanium, nickel, or alloys thereof. The plating process may include the formation of a plating mask, which may be formed by adhering and patterning a dry film, or forming a photo resist, followed by a light-exposure process and a development process. Metal foils 22A and 22B are then patterned in an etching process to form conductive features 28 (including 28A and 28B). The respective process is illustrated as process 206 in the process flow 200 shown in FIG. 23. The conductive features 28 on the opposite sides of dielectric core 20 may be interconnected through through-vias 26. Conductive features 28A may include Redistribution Lines (RDLs) and metal pads, and may be used as electrical connection lines, parts of the antennas (such as the patches of the patch antennas). For example, through-vias 26A and conductive features 28A may be used for electrical connection, which may be connected to die 56 in the resulting package 100 (FIG. 19). Conductive features 28B may be used for thermal dissipation. Through-vias 26B and conductive features 28B may be used as thermal paths for thermal dissipation, which are electrically floating in the resulting package 100 (FIG. 19).

Figure 4:
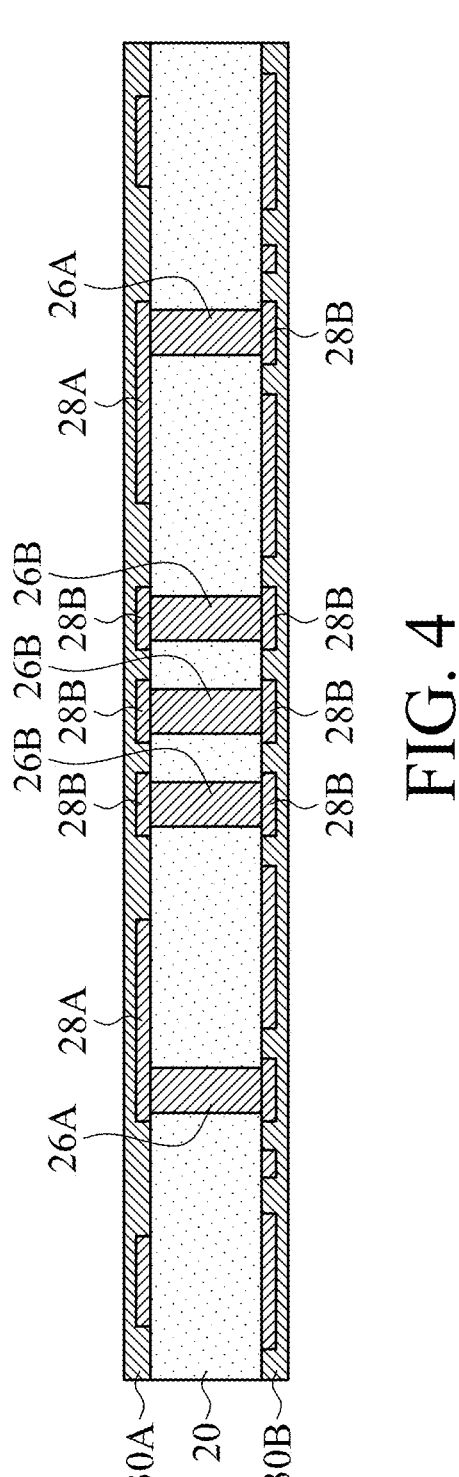
Figure 5:
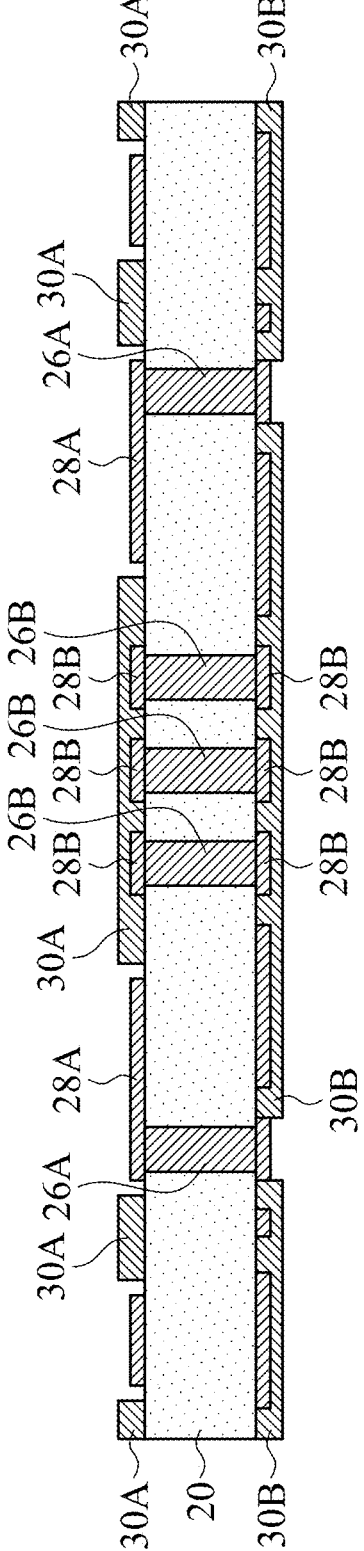

FIG. 4 illustrates the formation of dielectric mask layers 30A and 30B, which are formed of solder resist or other types of applicable dielectric materials. The respective process is illustrated as process 208 in the process flow 200 shown in FIG. 23. In a subsequent process, as shown in FIG. 5, dielectric layers 30A and 30B are patterned, for example, in an etching process, so that some of the conductive features 28 are exposed. The respective process is illustrated as process 210 in the process flow 200 shown in FIG. 23. For example, the portions of conductive features 28A used as parts of the multi-band antennas may be revealed for reducing signal isolation. The conductive features 28B used as thermal paths may be (or may not be) covered for reduced oxidation. A metal finish (not shown) may then be formed on the exposed conductive features 28, for example, through plating, to protect the exposed conductive features 28 from oxidation. In accordance with some embodiments of the present disclosure, the metal finish includes or comprises Electroless Nickel Electroless Palladium Immersion Gold (ENEPIG), Organic Solderability Preservative (OSP), Electroless Nickel Immersion Gold (ENIG), Direct Immersion Gold (DIG), or the like.

Figure 6:
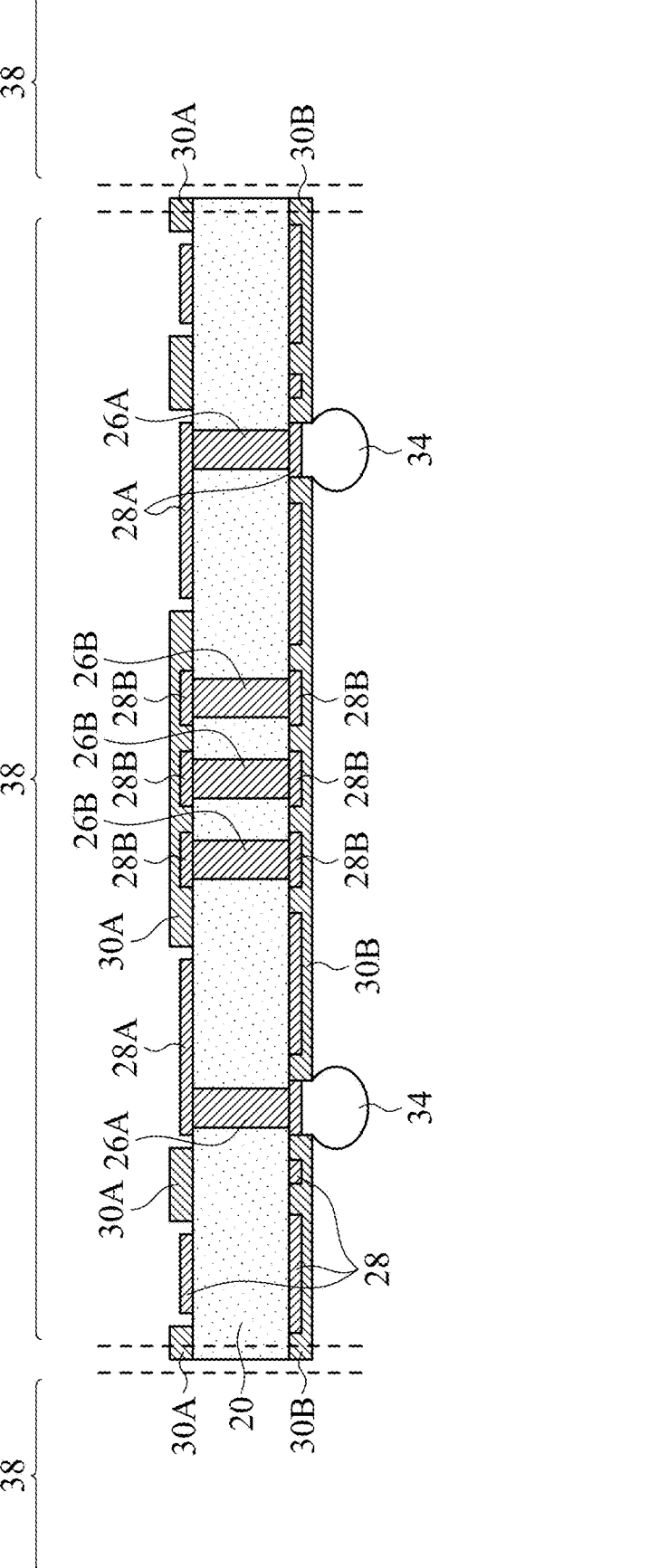

FIG. 6 illustrates the formation of electrical connectors 34. The respective process is illustrated as process 212 in the process flow 200 shown in FIG. 23. The formation of electrical connectors 34 may include placing solder balls on conductive features 28A, and then reflowing the solder balls. In accordance with alternative embodiments of the present disclosure, the formation of electrical connectors 34 includes performing a plating process to form solder layers on conductive features 28A, and then reflowing the solder layers. Electrical connectors 34 may also include non-solder metal pillars, or metal pillars and solder caps over the non-solder metal pillars, which may also be formed through plating. Next, a singulation process is performed, so that the illustrated substrate is sawed apart into a plurality of antenna substrates 38. The respective process is illustrated as process 214 in the process flow 200 shown in FIG. 23. Antenna substrates 38 are such named since they include some portions of the antennas.

Figure 7:
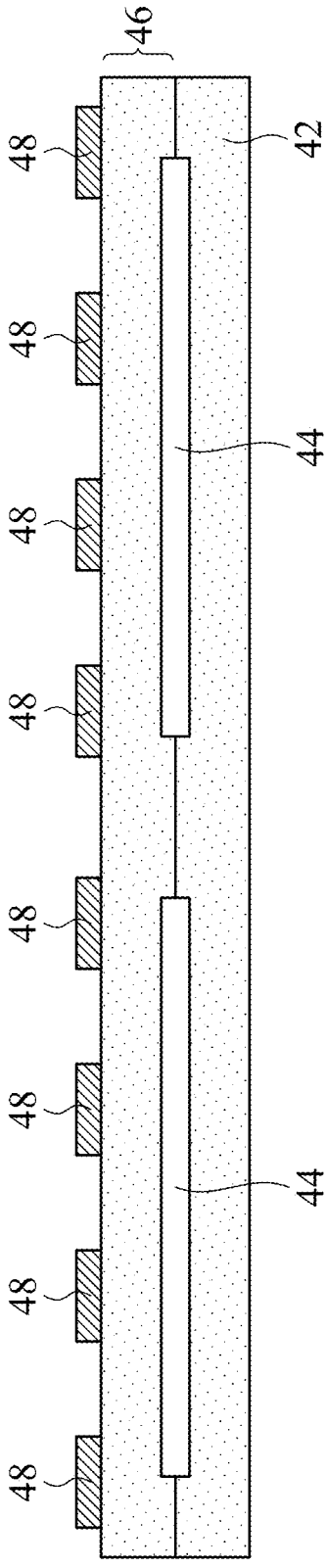
FIGS. 7 and 8 illustrate the cross-sectional views of intermediate stages in the formation of a device die in accordance with some embodiments.
Figure 7:
Figure 8:
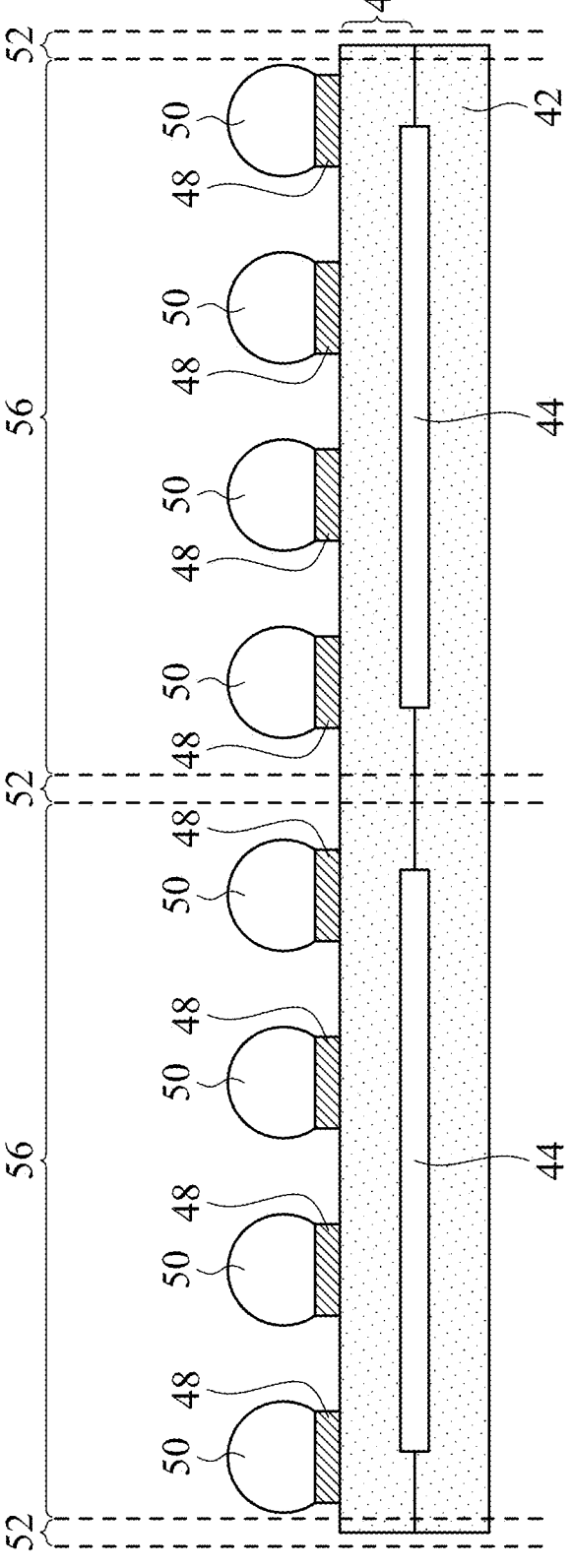
Figure 8:

FIGS. 7 and 8 illustrate the cross-sectional views of intermediate stages in the formation of a device die (which may be an RFIC die) in accordance with some embodiments. The corresponding processes are also reflected schematically in the process flow 200 shown in FIG. 23. Referring to FIG. 7, wafer 40 is provided. Wafer 40 includes semiconductor substrate 42 and the features formed at a top surface of semiconductor substrate 42. Semiconductor substrate 42 may be formed of crystalline silicon, crystalline germanium, silicon germanium, or the like.

Circuits 44 are formed in wafer 40, and circuits 44 may be RF circuits that are configured to generate and/or receive RF signals. Circuits 44 may also include logic circuits therein. In accordance with some embodiments of the present disclosure, circuits 44 include a Low Noise Amplifier (LNA), a low-loss filter, a power amplifier, a Baseband (BB) circuit, a Power Management Integrated Circuit (PMIC), memories, a Micro Electro Mechanical System (MEMS) device, and/or other active circuits.

Over circuits 44 is interconnect structure 46. Interconnect structure 46 includes metal lines and vias (not shown), which are formed in dielectric layers (also referred to as Inter-metal Dielectrics (IMDs)). The metal lines and vias may be formed of copper or copper alloys, and they can also be formed of other metals. In accordance with some embodiments of the present disclosure, the dielectric layers include low-k dielectric materials, which may comprise a carbon-containing low-k dielectric material, Hydrogen SilsesQuioxane (HSQ), MethylSilsesQuioxane (MSQ), or the like. Passivation layers, which are formed of non-low-k dielectric materials, are formed over the low-k dielectric layers. Surface conductive features 48, which may be Under-Bump Metallurgies (UBMs), metal pads, metal pillars, or the like, are formed at the surface of wafer 40. The respective process is illustrated as process 216 in the process flow 200 shown in FIG. 23.

FIG. 8 illustrates the formation of electrical connectors 50. The respective process is illustrated as process 218 in the process flow 200 shown in FIG. 23. The formation of electrical connectors 50 may include placing or plating solder balls on UBMs 48, and then reflowing the solder balls. Electrical connectors 50 may also include non-solder metal pillars, or metal pillars and solder caps over the non-solder metal pillars, which may also be formed through plating. Next, a singulation process is performed, so that wafer 40 is sawed apart into a plurality of device dies 56. The respective process is illustrated as process 220 in the process flow 200 shown in FIG. 23. Throughout the description, device dies 56 are alternatively referred to as RFIC dies 56.

Figure 9:
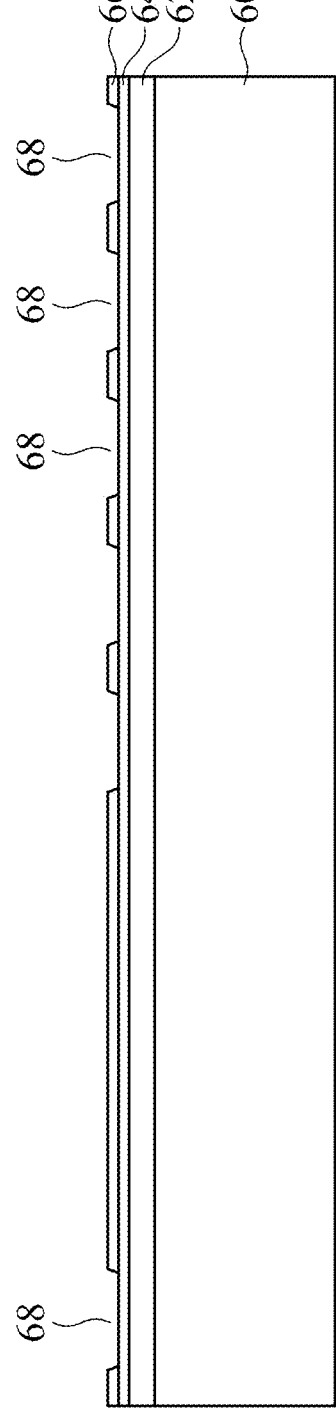
FIG. 9 through 19 illustrate the cross-sectional views of intermediate stages in the formation of a package including RF antennas in accordance with some embodiments.

FIG. 9 through 19 illustrate the cross-sectional views of intermediate stages in the formation of a package including RF antennas in accordance with some embodiments. The corresponding processes are also reflected schematically in the process flow 200 shown in FIG. 23. FIG. 9 illustrates carrier 60 and release film 62 disposed on carrier 60. Carrier 60 may be a glass carrier, a ceramic carrier, or the like. Carrier 60 may have a round or rectangular top-view shape, and may have a size of a silicon wafer. Release film 62 may be formed of a polymer-based material (such as a Light-To-Heat-Conversion (LTHC) material), which may be removed along with carrier 60 from the overlying structures that will be formed in subsequent steps. In accordance with some embodiments of the present disclosure, release film 62 is formed of an epoxy-based thermal-release material. In other embodiments, release film 62 is formed of a ultra-violet (UV) glue. Release film 62 may be dispensed in a flowable form and then cured.

Dielectric buffer layer 64 is formed on release film 62. In accordance with some embodiments of the present disclosure, dielectric buffer layer 64 is formed of an organic material such as a polymer, which may also be a photo-sensitive material such as polybenzoxazole (PBO), polyimide (PI), Benzocyclobutene (BCB), or the like. Dielectric buffer layer 64 may be patterned through light-exposure and development. In accordance with alternative embodiments of the present disclosure, dielectric buffer layer 64 is formed of an inorganic material, which may be a nitride such as silicon nitride, an oxide such as silicon oxide, PhosphoSilicate Glass (PSG), BoroSilicate Glass (BSG), Boron-doped PhosphoSilicate Glass (BPSG), or the like, combinations thereof, and/or multi-layers thereof.

Dielectric layer 66 is formed over dielectric buffer layer 64, and is then patterned. The respective process is illustrated as process 222 in the process flow 200 shown in FIG. 23. In accordance with some embodiments of the present disclosure, dielectric layer 66 is formed of an organic material such as a polymer, which may be a photo-sensitive polymer such as PBO, polyimide (PI), BCB (Benzocyclobutene), or includes epoxy, resin, prepreg (which comprises epoxy, resin, and/or fiber glass), glass, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), flex (polyimide), ABF (Ajinomoto build-up film), Bismaleimide Triazine (BT) resin, BCB, ceramic, Polytetrafluoroethylene (PTFE), Teflon™, or the like. In accordance with alternative embodiments of the present disclosure, dielectric layer 66 is formed of an inorganic material, which may be a nitride such as silicon nitride, an oxide such as silicon oxide, PSG, BSG, BPSG, or the like. Dielectric layer 66 is then patterned to form openings 68.

Figure 10:
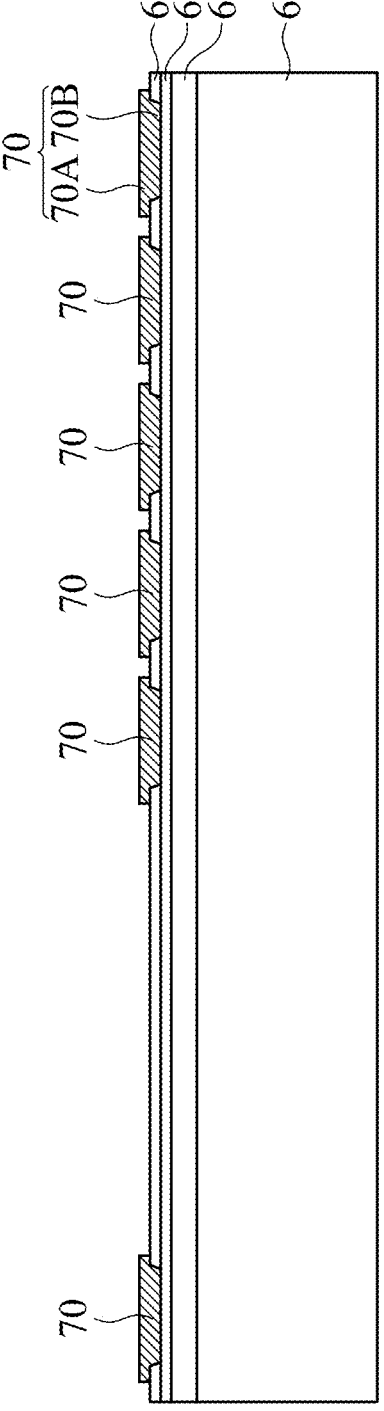

Referring to FIG. 10, RDLs 70 are formed. RDLs 70 may include RDLs 70A and metal pads 70B underlying and joining to RDLs 70A. The respective process is illustrated as process 224 in the process flow 200 shown in FIG. 23. The formation of RDLs 70 may include forming a metal seed layer (not shown) over dielectric buffer layer 64, forming a patterned mask (not shown) such as a photo resist over the metal seed layer, and then performing a metal plating process on the exposed seed layer. The patterned mask is then removed, followed by the removal of the portions of the seed layer previously covered by the removed patterned mask, leaving RDLs 70 as in FIG. 10. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating, electro-chemical plating, or the like.

Figure 11:
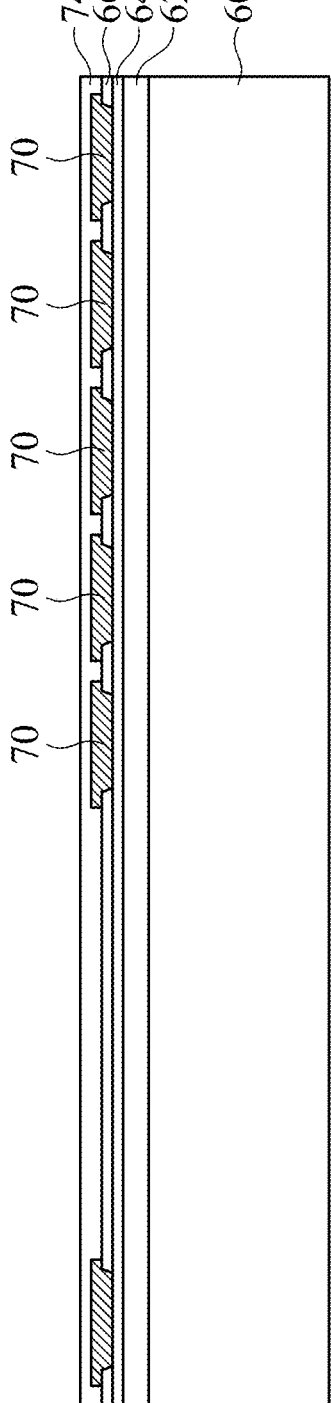

Next, dielectric layer 74 is formed on RDLs 70, as shown in FIG. 11. The bottom surface of dielectric layer 74 is in contact with the top surfaces of RDLs 70 and dielectric layer 66. In accordance with some embodiments of the present disclosure, the material of dielectric layer 74 is selected from the same group of candidate materials for forming dielectric layer 66, and may be selected from PBO, polyimide, silicon nitride, silicon oxide, or the like. Dielectric layer 74 may then be patterned to form openings, through which some portions of RDLs 70A are exposed.

Figure 12:
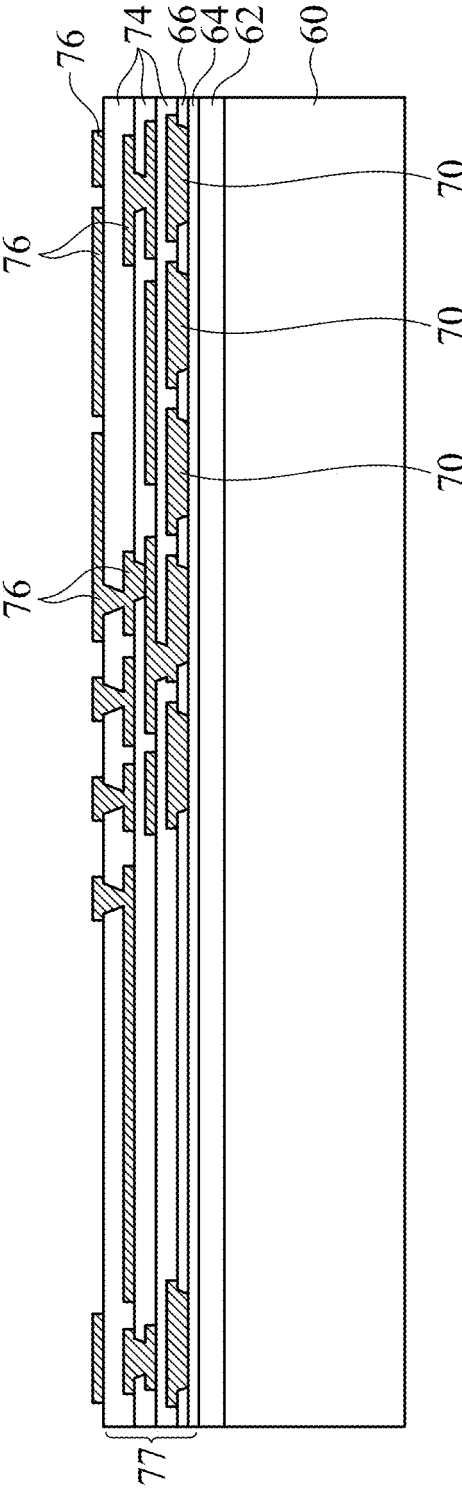

FIG. 12 illustrates the formation of additional dielectric layers 74 and RDLs 76. The formation processes of the additional dielectric layers 74 and RDLs 76 are illustrated as process 226 in the process flow 200 shown in FIG. 23. The materials and the formation processes of the additional dielectric layers 74 may be similar to that of dielectric layer 64. The materials and the formation processes of RDLs 76 may be similar to that of RDLs 70. Therefore, the details for forming the additional dielectric layers 74 and RDLs 76 are not repeated herein. The top layer of RDLs 76 may be used for electrical routing and/or bonding. Throughout the description, the dielectric layers 64, 66 and 74 and RDLs/pads 70 and 76 are collectively referred to as redistribution structure 77.

Figure 13:
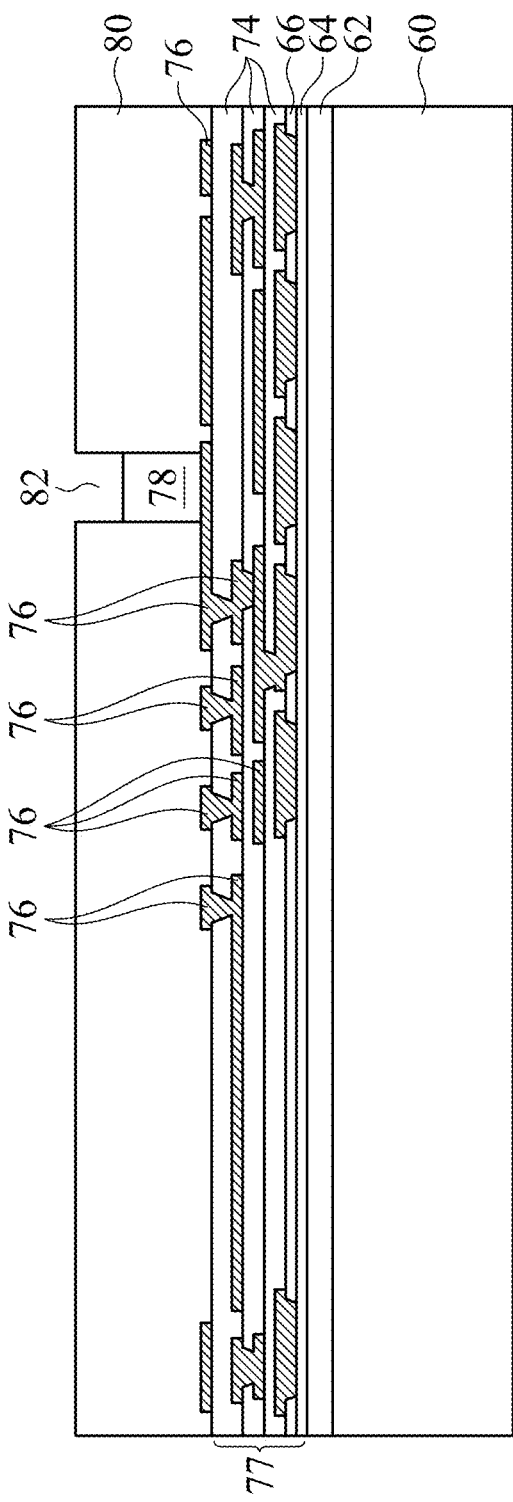
Figure 14:
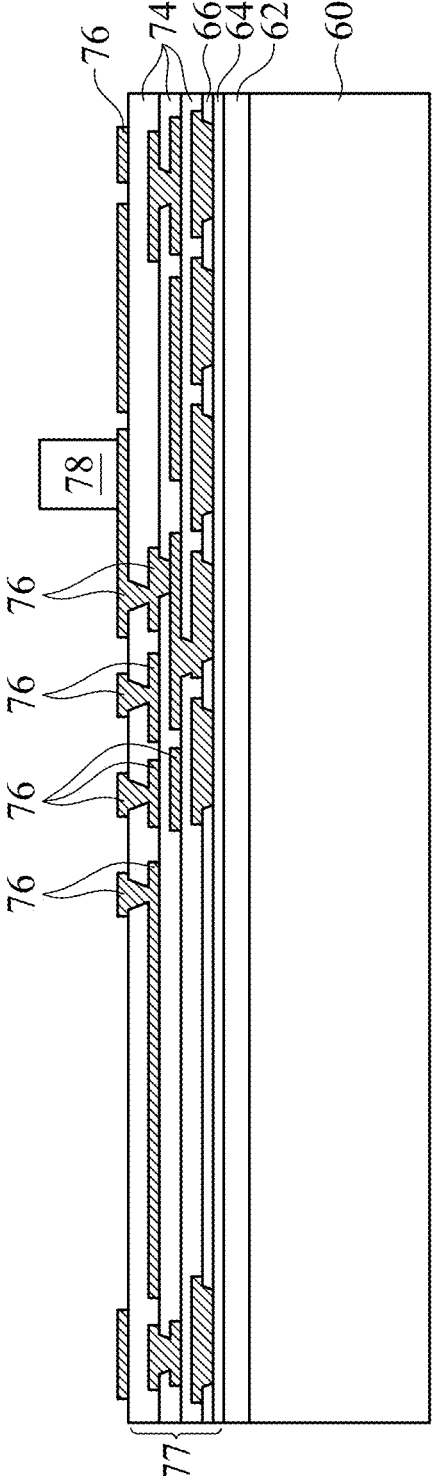

FIG. 13 illustrates the formation of metal pillar 78. The respective process is illustrated as process 228 in the process flow 200 shown in FIG. 23. Metal pillar 78 may comprise copper, nickel, palladium, solder, alloys thereof, and/or multi-layers thereof. In accordance with some embodiments, the formation of metal pillar 78 includes forming a blanket seed layer (not shown), forming a patterned plating mask 80, which be formed of photo resist and patterned through light-exposure and development, and plating metal pillar 78 in the opening 82 in the plating mask 80. The metal seed layer may include a titanium layer and a copper layer over the titanium layer, both of which may be formed through PVD. Next, plating mask 80 is removed, and the portions of the metal seed layer previously covered by plating mask 80 are etched, leaving metal pillar 78. The resulting structure is shown in FIG. 14. In accordance with alternative embodiments, the metal seed layer is not formed, and metal pillar 78 is plated through the exposed portions of the RDL 76 exposed to the opening 82. After the plating mask 80 is removed, the resulting structure is also similar to what is shown in FIG. 14.

Figure 15:
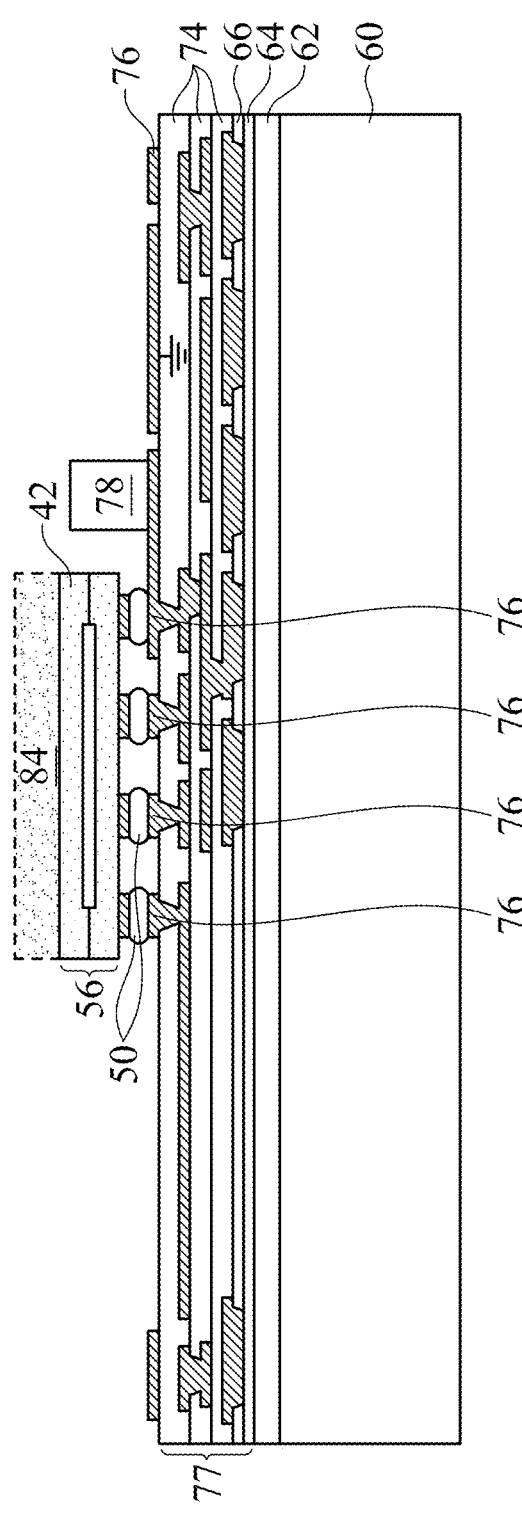

Referring to FIG. 15, RFIC die 56 is bonded to redistribution structure 77, for example, through solder regions, which are reflowed to join RFIC die 56 to RDLs 76. The respective process is illustrated as process 230 in the process flow 200 shown in FIG. 23. In accordance with some embodiments of the present disclosure, an adhesive film 84 is attached to the back surface of RFIC die 56. Adhesive film 84 may be attached to RFIC die 56 before the singulation process (as shown in FIG. 8) of wafer 40, and is singulated along with wafer 40. Accordingly, adhesive film 84 has edges flush with the corresponding edges of RFIC die 56. It is appreciated that although there is one metal pillar 78 illustrated, in manufacturing processes, there may be a plurality of metal pillars 78 formed, which may be aligned to a ring, and RFIC die 56 may be encircled by the ring.

In addition, one RFIC die 56 is illustrated as bonded to redistribution structure 77 as an example. There may be a plurality of device dies and independent passive devices bonded to RDLs 70, which are illustrated as device die 57 and independent passive device 122 in FIG. 22A as an example. These dies may include, and are not limited to, the dies including LNAs, low-loss filters, power amplifiers, baseband circuits, PMICs, memories, MEMS devices, and/or other active circuits.

Figure 16:
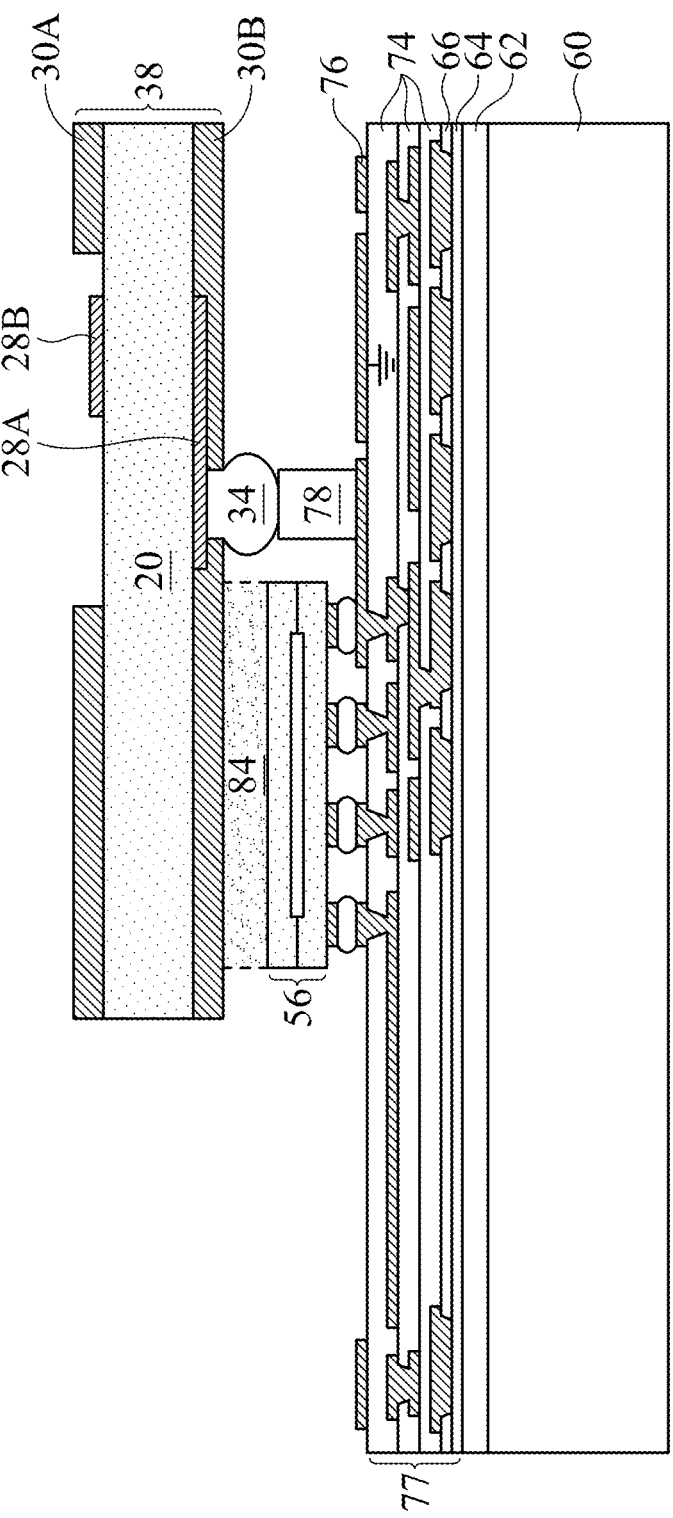

FIG. 16 illustrates the bonding of antenna substrate 38 onto redistribution structure 77. The respective process is illustrated as process 232 in the process flow 200 shown in FIG. 23. The antenna substrate 38 as shown in FIG. 16 is schematic, with some details not shown, and the antenna substrate 38 may have the structure shown in FIG. 6. In accordance with some embodiments of the present disclosure, the bonding is through electrical connectors 34, which may include solder regions. When adhesive film 84 is on RFIC die 56, the bottom surface of antenna substrate 38 may be in contact with adhesive film 84. Adhesive film 84 has two functions. Firstly, it fills the gap between RFIC die 56 and antenna substrate 38. This gap may be too small for the subsequently disposed encapsulant 86 (FIG. 17) to fill in, and the use of adhesive film 84 prevents the formation of the unfilled small gap. Secondly, it helps maintain the standoff distance between antenna substrate 38 and metal pillar 78, and hence prevents the solder in electrical connector 34 from being crushed. RFIC die 56 may be overlapped by antenna substrate 38. Furthermore, the size of antenna substrate 38 is smaller than the underlying redistribution structure 77, so that some portions of redistribution structure 77 are not covered by antenna substrate 38, so these portions of redistribution structure 77 may be used as portions of antennas.

Figure 17:
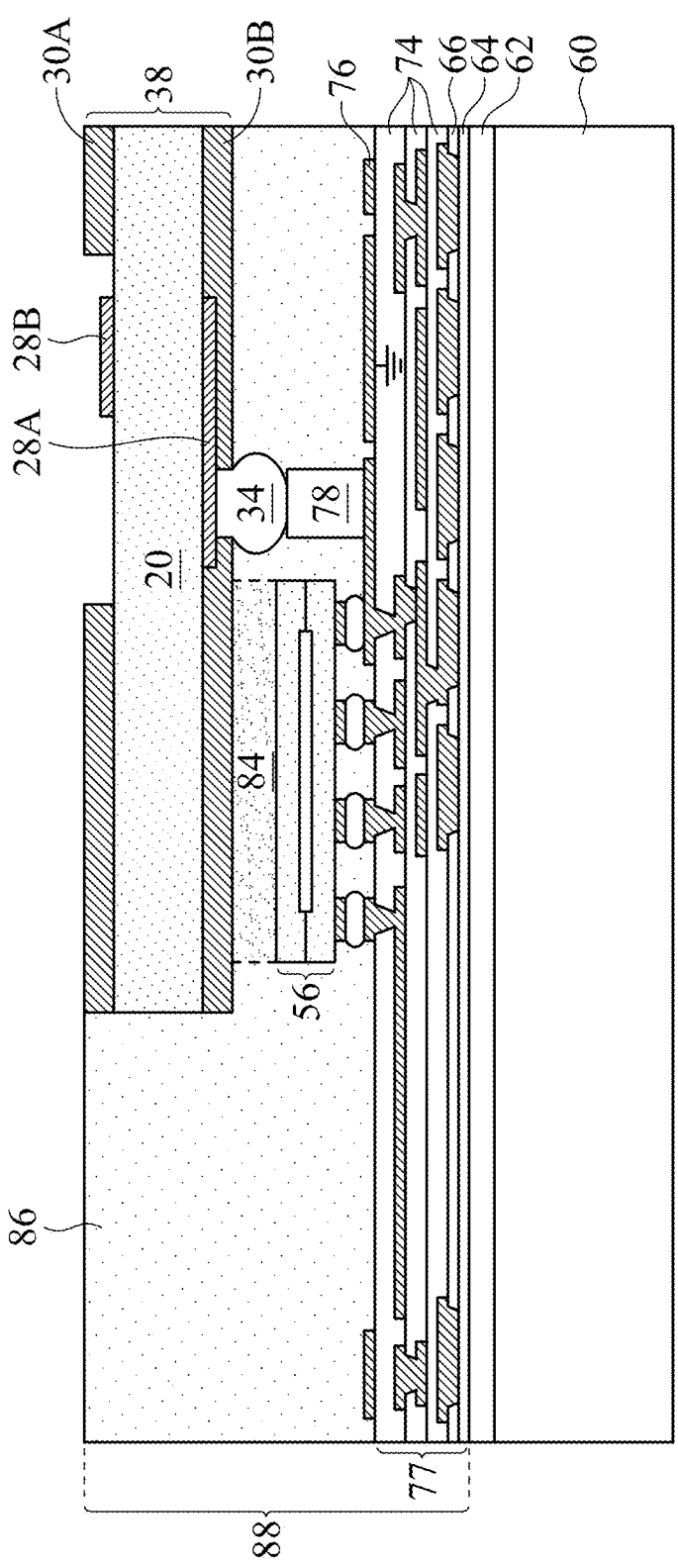

Next, as also shown in FIG. 17, encapsulant 86 is disposed to encapsulate antenna substrate 38, RFIC die 56, and metal pillar 78 therein, and is then cured. The respective process is illustrated as process 234 in the process flow 200 shown in FIG. 23. Encapsulant 86 fills the gaps between RFIC die 56 and antenna substrate 38. Encapsulant 86 may include a molding compound, a molding underfill, an epoxy, and/or a resin. In accordance with some embodiments of the present disclosure, encapsulant 86 comprises a base material and filler particles in the base material. The base material may be an epoxy, a resin, a polymer, or the like. The filler particles may be spherical particles of silica, aluminum oxide, or the like. The encapsulation process may be performed through expose molding, with a release film (not shown) being pressed on antenna substrate 38 to prevent encapsulant 86 from being molded over antenna substrate 38. When adhesive film 84 is formed, encapsulant 86 also surrounds adhesive film 84. Otherwise, when adhesive film 84 is not formed, encapsulant 86 is filled into the gap between RFIC die 56 and antenna substrate 38. Throughout the description, the structures and components overlying release film 62 are in combination referred to as reconstructed wafer 88.

Next, reconstructed wafer 88 is de-bonded from carrier 60. The respective process is illustrated as process 236 in the process flow 200 shown in FIG. 23. In accordance with some embodiments of the present disclosure, to de-bond reconstructed wafer 88, a light beam is projected on release film 62, and the light penetrates through the transparent carrier 60. In accordance with some embodiments of the present disclosure, the light includes a laser beam, which is scanned through the entire release film 62. As a result of the light-exposure (such as the laser scanning), carrier 60 may be lifted off from dielectric buffer layer 64, and hence reconstructed wafer 88 is de-bonded (demounted) from carrier 60. During the light exposure, release film 62 is decomposed in response to the heat introduced by the light exposure, allowing carrier 60 to be separated from reconstructed wafer 88. The resulting reconstructed wafer 88 is shown in FIG. 18.

Figure 18:
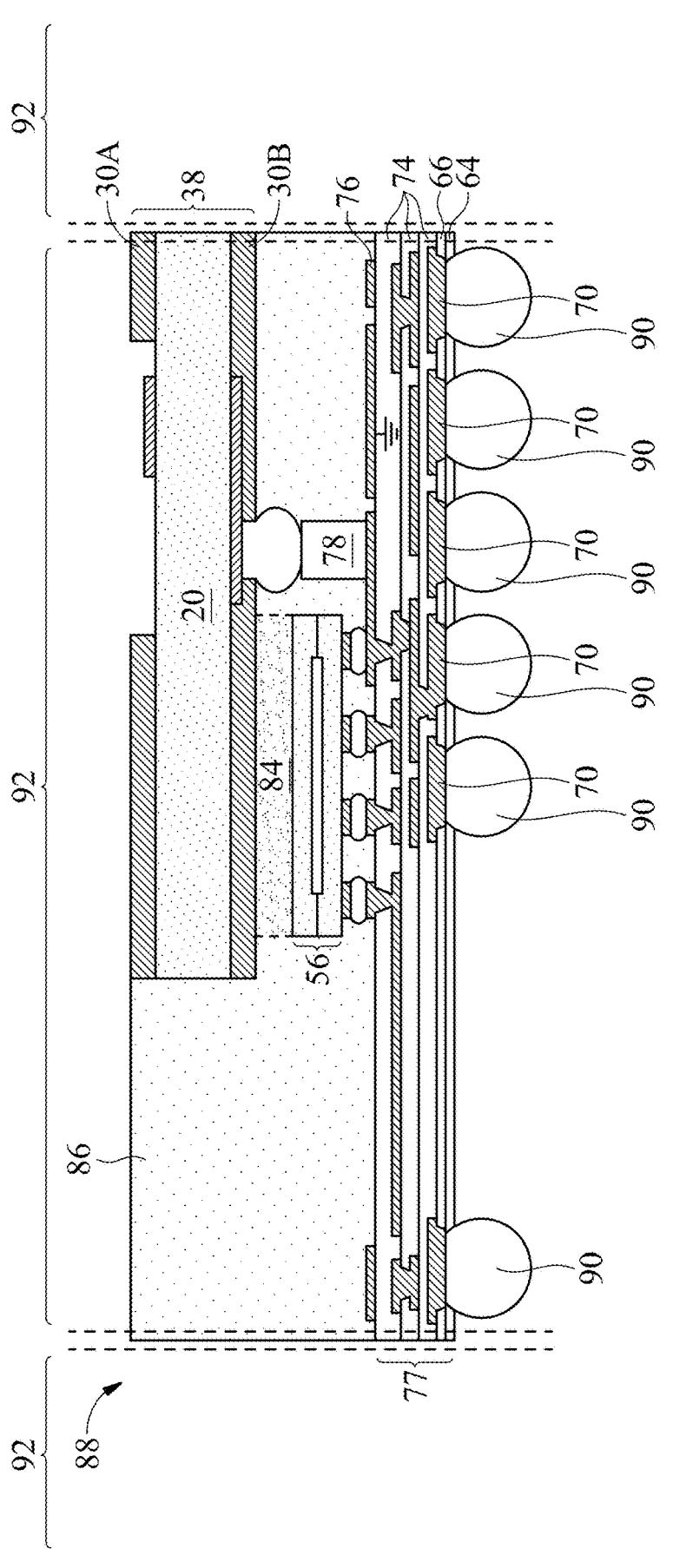

FIG. 18 further illustrates the formation of electrical connectors 90, which may include solder regions. The respective process is illustrated as process 238 in the process flow 200 shown in FIG. 23. Next, reconstructed wafer 88 may be placed on a tape (not shown), which is attached to a dicing frame (not shown). Reconstructed wafer 88 is then singulated into a plurality of packages 92, for example, in a sawing process. The respective process is illustrated as process 240 in the process flow 200 shown in FIG. 23.

FIG. 19 illustrates the bonding of package 92 to a package component 94 through solder regions 90, hence forming package 100. In accordance with some embodiments, package component 94 is a printed circuit board, another package, a package substrate, an interposer, or the like. An underfill (not shown) may be (or may not be) disposed between package 92 and package component 94 to protect solder regions 90. The resulting package 100 is a multi-band antenna package including multi-band antennas 104 and 106 therein.

In accordance with some embodiments of the present disclosure, package 100 includes antenna 104, which includes patch 76A and reflector 102. Patch 76A is a part of RDLs 76, which is in redistribution structure 77. Patch 76A is also electrically and signally connected to RFIC die 56 through the feed line therebetween, wherein the feed line includes some parts of RDLs 76. The reflector 102 of antenna 104 may be electrically grounded, for example, through a solder region 90, and RDLs 70 and 74, and an electrical connector 50 to connect to an electrical ground in RFIC die 56. Reflector 102 is formed in a selective layer of package component 94, for example, in the top layer, a bottom layer, or any other layer in between. The spacing S1 between patch 76A and reflector 102 may be in the range between about 10 μm and about 600 μm. The positions of patch 76A and reflector 102 may be selected to adjust spacing S1 to a desirable value, in addition to selecting an appropriate value for the height of solder regions 90.

Package 100 also includes antenna 106 in accordance with some embodiments. Antenna 106 includes patch 28A1 and reflector 76B, with reflector 76B being a part of RDLs 76. Patch 28A1 is a part of conductive features 28 in antenna substrate 38. Patch 28A1 is also electrically and signally connected to RFIC die 56 through the feed line therebetween, wherein the feed line includes parts of RDLs 76, metal pillar 78, electrical connector 34, and a portion of conductive feature 28A. Reflector 76B is electrically grounded, for example, through an RDL 76 to connect to the ground in RFIC die 56. The spacing S2 between patch 28A1 and reflector 76B may be in the range between about 10 μm and about 600 μm. The positions of patch 28A1 and reflector 76B may be selected to adjust spacing S2 to an appropriate value, in addition to adjusting the height of electrical connector 34 and metal pillar 78. Due to the flexibility in the adjustment of the areas and the spacings of each of antennas 104 and 106, the center frequency of antenna 104 may be equal to, higher, or lower than the center frequency of antenna 106, and the bandwidth of antenna 104 may be wider than, equal to, or narrower than the bandwidth of antenna 106.

In accordance with some embodiments of the present disclosure, antenna 106 further includes patch 28A2, which is electrically floating. Accordingly, antenna 106 includes stacked patches 28A2 and 28A1, so that the bandwidth of antenna 106 may be further increased. In accordance with alternative embodiments, patch 28A2 is not formed. Accordingly, patch 28A2 is illustrated using dashed lines to show that it may or may not be formed in accordance with different embodiments.

Figure 20:
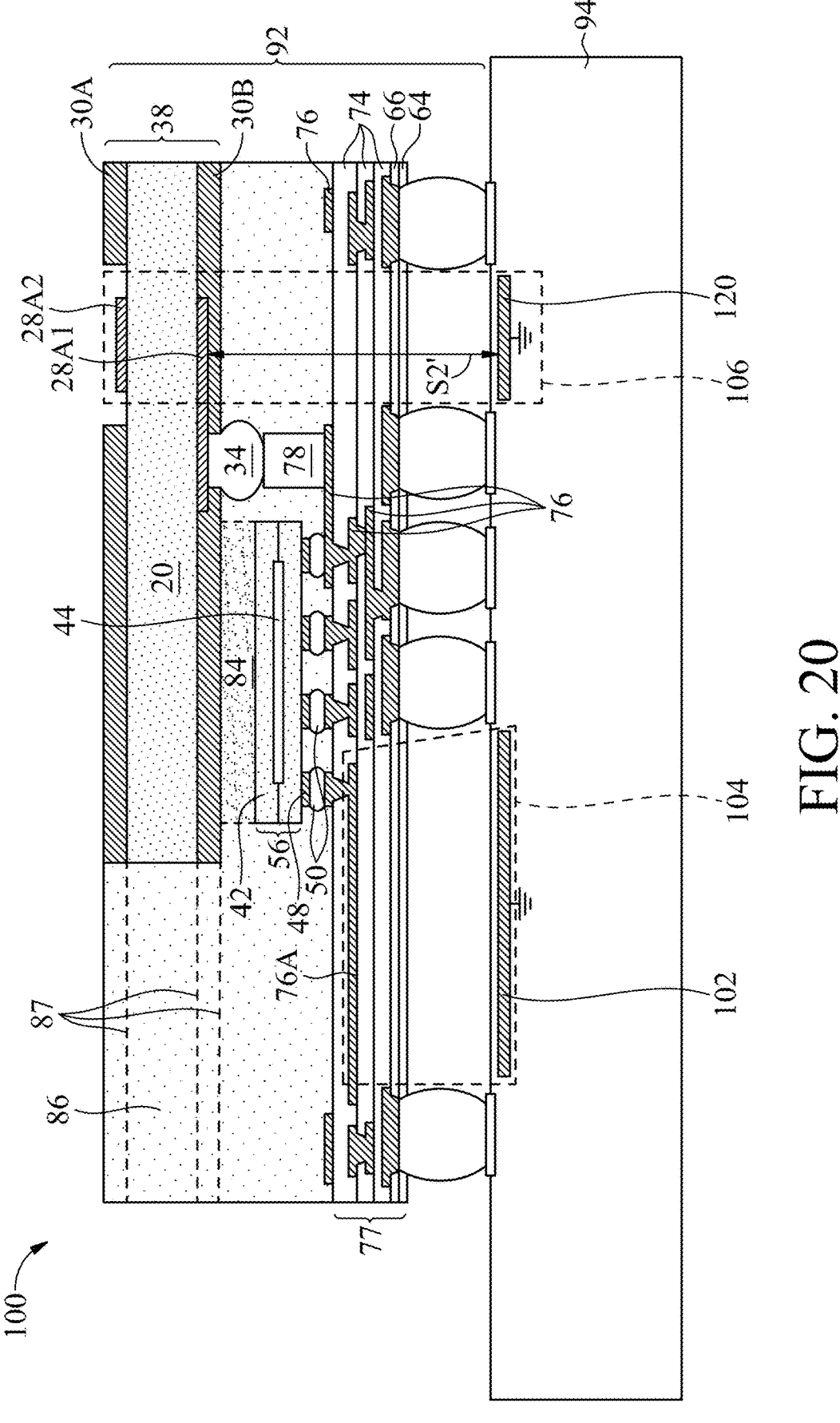
FIGS. 20 and 21 illustrate the cross-sectional views of some packages including RF antennas in accordance with some embodiments.
Figure 21:
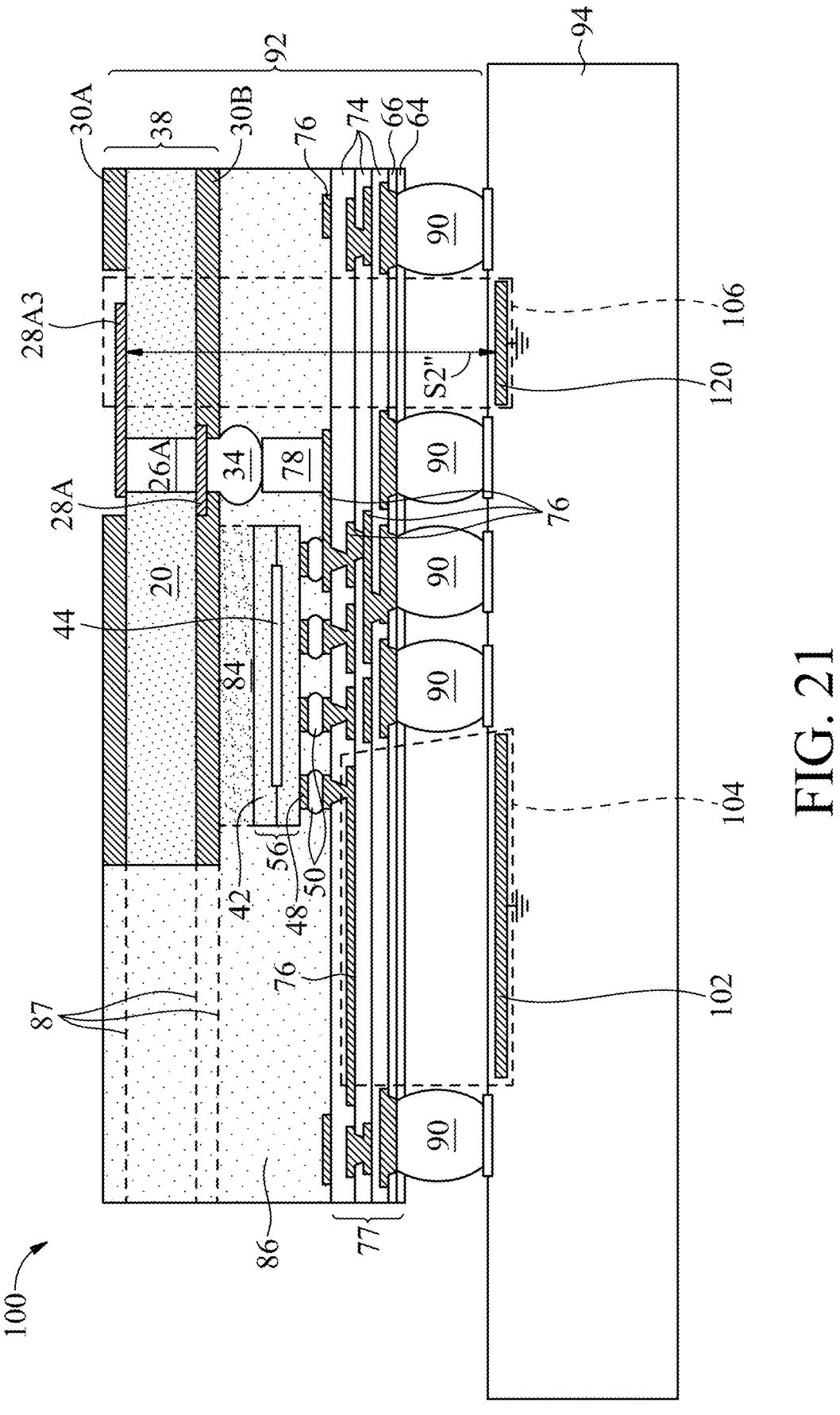
Figure 22A:
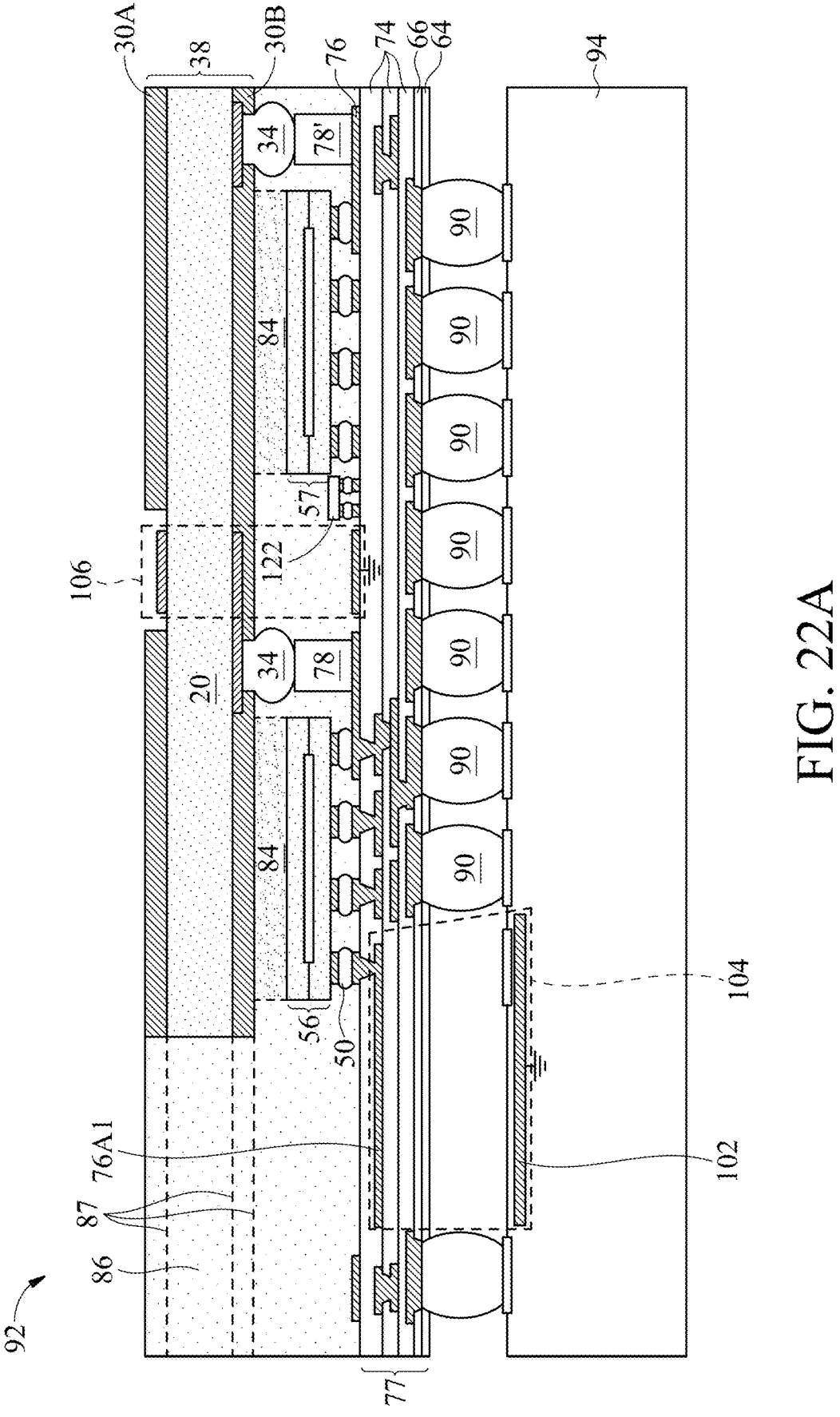
FIGS. 22A and 22B illustrate a cross-sectional view and a plane view, respectively, of a package including RF antennas in accordance with some embodiments.

As shown in FIG. 19, in accordance with some embodiments, antenna 104 is offset from antenna substrate 38, so that antenna substrate 38 does not cover antenna 104 to adversely block antenna 104 from receiving or emitting signal upwardly. In accordance with alternative embodiments, antenna substrate 38 may extend more to cover antenna 104 when the materials of substrate 38 do not significantly affect antenna 104, and dashed lines 87 illustrate where dielectric core 20 and dielectric layers 30A and 30B may extend to. Accordingly, the left edges of encapsulant 86, antennal substrate 38, and redistribution structure 77 may be flushed with each other, and the right edges of encapsulant 86, antennal substrate 38, and redistribution structure 77 may be flushed with each other. The similar dashed lines 87 are also shown in FIGS. 20, 21, and 22A. RFIC die 56, on the other hand, may be overlapped by antenna substrate 38. Each of antennas 104 and 106 may be a patch antenna and or an end-fire antenna. In accordance with some embodiments, antenna 104 is a patch antenna, and its signal direction is up direction. Antenna 106 may also be an end-fire antenna, which may be formed on the right end of redistribution structure 77 and antenna substrate 38 to allow the signal firing direction to be to the right of antenna 106 in accordance with some embodiments of the present disclosure.

In accordance with some embodiments, the (top-view) areas of antennas 104 and 106 affect the center frequencies of the respective antennas, and the greater the areas, the higher the center frequencies. On the other hand, the spacings S1 and S2 may affect the bandwidths of the respective antennas 104 and 106, and the greater the spacings S1 and S2, the greater the respective bandwidths. In accordance with some embodiments of the present disclosure, each of the spacing S1 and S2 may be adjusted independently without affecting the other, allowing the bandwidths of the respective antennas 104 and 106 to be adjusted independently to be in desirable ranges. Spacings S1 and S2 may be different from each other or equal to each other. Also, the areas of antennas 104 and 106 may also be adjusted independently, allowing the center frequency values of the respective antennas 104 and 106 to be adjusted independently. Accordingly, antennas 104 and 106 may have different bands, and are in combination form multi-band antennas.

It is appreciated that adopting the structure according to the embodiments of the present disclosure may result in different spacings by shifting the positions of the antenna components. For example, FIGS. 20 and 21 illustrate the packages 100 in accordance with some embodiments of the present disclosure. Unless specified otherwise, the materials and the formation processes of the components in these embodiments are essentially the same as the like components, which are denoted by like reference numerals in the preceding embodiments shown in FIGS. 1 through 19. The details regarding the formation processes and the materials of the components shown in FIGS. 20 and 21 may thus be found in the discussion of the preceding embodiments.

Referring to FIG. 20, the reflector 120 of antenna 106, instead of being formed in redistribution structure 77 (as shown as 76B in FIG. 19), is formed in package component 94. This significantly increased the spacing S2', which is the spacing between patch 28A1 and reflector 120. In accordance with some embodiments of the present disclosure, spacing S2' is in the range between about 20 μm and about 1,200 μm. There is no electrical conductive feature located between patch 28A1 and reflector 120. The increase in the spacing S2' may result in the increase in the bandwidth of antenna 106, and hence antenna 106 may be used when a large bandwidth is desirable. Furthermore, patch 28A2 may be or may not be formed, and is illustrated using dashed line.

Referring to FIG. 21, the reflector 120 of antenna 106, instead of being formed in redistribution structure 77, is also formed in package component 94. Furthermore, patch 28A3 is formed on the top side of antenna substrate 38, and the feed line connecting to patch 28A3 includes metal pillar 78, solder region 34, conductive feature 28A and through-via 26A in antenna substrate 38. This significantly increases the spacing S2'', which is the spacing between patch 28A3 and reflector 120. In accordance with some embodiments of the present disclosure, spacing S2'' is in the range between about 200 μm and about 1,700 μm. There is no electrical conductive feature located between patch 28A3 and reflector 120. The increase in the spacing S2'' may result in the further increase in the bandwidth of antenna 106, hence antenna 106 may be used when a large bandwidth is desirable.

FIG. 22A illustrates an additional device die 57 bonded to redistribution structure 77. The bonding may be through metal pillar 78', which connects device die 57 to antenna substrate 38. In accordance with some embodiments, device die 57 is also an RFIC die. Each of antennas 104 and 106 may be electrically connected to one of device dies 56 and 57. In accordance with other embodiments, device die 57 includes other circuits other than the RFIC circuits, and the other circuits include, and are not limited to, LNA, low-loss filter, power amplifier, PMICs, memories, MEMS devices, and/or other logic circuits. Independent Passive Device (IPD) 122, which may be a capacitor, an inductor, a resistor, or the like, may be bonded to redistribution structure 77 for signal enhancement.

Figure 22B:
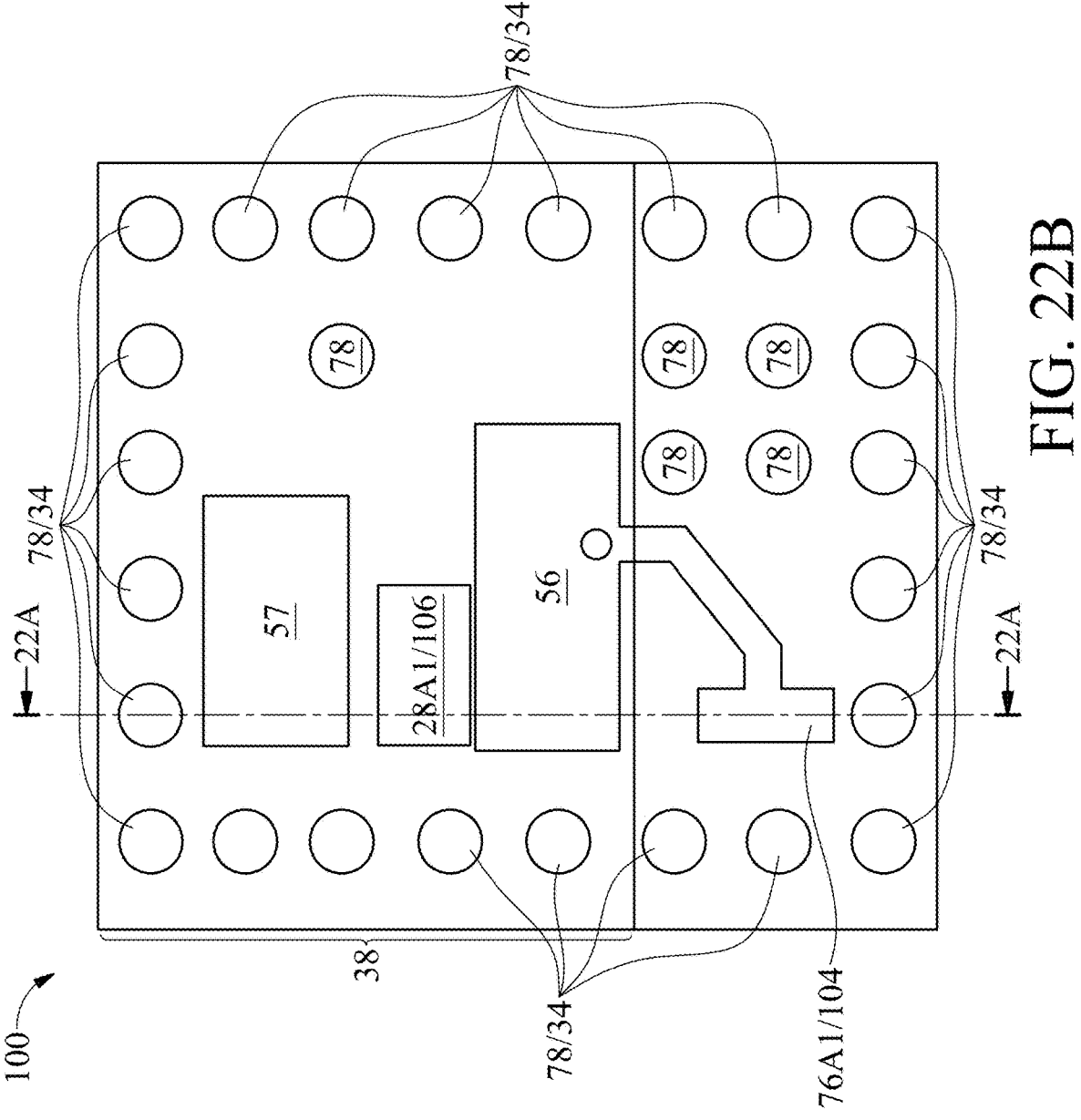

FIG. 22B illustrates a plane view of the package 100 as shown in FIG. 22A. The cross-sectional view shown in FIG. 22A is obtained from the reference cross-section 22A-22A in FIG. 22B. There are a plurality of metal pillars 78 (and the corresponding solder regions 34), which may be arranged as a ring encircling RFIC die 56 and device die 57. The patches 76A and 28A1 are also illustrated.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By utilizing different package components in a package to form antennas with different spacings, the bandwidths of the antennas may be designed to have desirable values. The different spacings are achieved by placing the components of antennas at selected positions. Furthermore, wide bandwidths maybe achieved by adopting stacked patch antennas. Accordingly, multi-band antennas may be integrated into a same package without sacrificing the center frequencies and bandwidths of the antennas.

In accordance with some embodiments of the present disclosure, a method includes bonding an antenna substrate to a redistribution structure, wherein the antenna substrate comprises a first part of a first antenna, and the redistribution structure comprises a second part of the first antenna; encapsulating the antenna substrate in an encapsulant; and bonding a package component to the redistribution structure, wherein one of the redistribution structure and the antenna substrate comprises a third part of a second antenna, and the package component comprises a fourth part of the second antenna. In an embodiment, the method further comprises bonding an RFIC die to the redistribution structure, wherein the RFIC die is electrically coupled to one of the first antenna and the second antenna. In an embodiment, the method further comprises adhering an adhesive film on the RFIC die, wherein the adhesive film have opposite surfaces contacting the RFIC die and the antenna substrate. In an embodiment, the antenna substrate and the package component are bonded to opposite sides of the redistribution structure. In an embodiment, the first part of the first antenna comprises a patch, and the second part of the first antenna comprises a grounded reflector. In an embodiment, the third part of the second antenna comprises a patch, and the fourth part of the first antenna comprises a grounded reflector. In an embodiment, the method further comprises forming the redistribution structure comprising: forming a plurality of redistribution lines, with the first part of the first antenna and the third part of the second antenna being in the plurality of redistribution lines; and forming a metal pillar on one of the plurality of redistribution lines, wherein the antenna substrate is bonded to the metal pillar. In an embodiment, the method further comprises forming the antenna substrate comprising: forming through-holes in a blanket substrate, wherein the blanket substrate comprises a dielectric core, and metal films on opposite sides of the dielectric core; filling the through-holes to form through-vias; and etching the metal films to form redistribution lines connecting to the through-vias.

In accordance with some embodiments of the present disclosure, a method includes bonding an RFIC die to a redistribution structure; bonding an antenna substrate to the redistribution structure; and bonding a printed circuit board to the redistribution structure, wherein each of the redistribution structure, the antenna substrate, and the printed circuit board comprises at least one component selected from a first antenna and a second antenna, wherein the first antenna comprises a first patch and a first reflector having a first spacing therebetween, and the second antenna comprises a second patch and a second reflector having a second spacing therebetween, with the first spacing being different from the second spacing. In an embodiment, first components of the first antenna are distributed to both of the redistribution structure and the antenna substrate, and second components of the second antenna are distributed to both of the redistribution structure and the printed circuit board. In an embodiment, the method further comprises forming the redistribution structure comprising: forming a plurality of dielectric layers; and forming a plurality of redistribution lines, with parts of the first antenna and the second antenna in the redistribution structure being in the plurality of redistribution lines. In an embodiment, the method further comprises forming a metal pillar on a top redistribution line in the plurality of redistribution lines, wherein a conductive feature in the antenna substrate is bonded to the metal pillar. In an embodiment, the conductive feature is electrically connected to a patch in the first antenna. In an embodiment, the redistribution structure is bonded to the printed circuit board through a plurality of solder regions, and a component in the second antenna is in the printed circuit board, and is connected to the RFIC die through one of the plurality of solder regions.

In accordance with some embodiments of the present disclosure, a package includes a redistribution structure; an antenna substrate bonded to the redistribution structure; and a printed circuit board bonded to the redistribution structure, wherein the redistribution structure, the antenna substrate, and the printed circuit board in combination form a first antenna and a second antenna, with each of the redistribution structure, the antenna substrate, and the printed circuit board comprising at least one component of the first antenna and the second antenna. In an embodiment, the first antenna comprises a first patch and a first reflector having a first spacing therebetween, and the second antenna comprises a second patch and a second reflector having a second spacing therebetween, and the first spacing is different from the second spacing. In an embodiment, the package further comprises an RFIC die bonded to the redistribution structure, wherein the RFIC die is electrically connected to one of the first antenna and the second antenna. In an embodiment, the package further comprises an adhesive film comprising a first surface contacting the RFIC die, and an opposite second surface contacting the antenna substrate; and an encapsulant encapsulating the antenna substrate and the RFIC die therein. In an embodiment, a top surface of the encapsulant is substantially coplanar with a top surface of the antenna substrate. In an embodiment, the first antenna comprises a patch antenna, with the antenna substrate comprising a patch of the patch antenna, and one of the redistribution structure and the printed circuit board comprises a reflector of the patch antenna.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a device die;
an antenna substrate over the device die and comprising:
a dielectric core;
a first dielectric layer over the dielectric core; and
a second dielectric layer underlying the dielectric core, wherein edges of the dielectric core, the first dielectric layer, and the second dielectric layer are vertically aligned;
an antenna electrically coupling to the device die, the antenna comprising:
a first portion in the antenna substrate; and
a second portion in a region lower than the device die; and
an encapsulant encapsulating the device die therein, wherein the encapsulant contacts the antenna substrate.

2. The package of claim 1 further comprising a solder region contacting the first portion of the antenna.

3. The package of claim 1, wherein the encapsulant contacts the antenna substrate to form a vertical interface.

4. The package of claim 1, wherein the edges of the dielectric core, the first dielectric layer, and the second dielectric layer are vertically aligned to an additional edge of the encapsulant.

5. The package of claim 1, wherein the antenna substrate further comprises:

a first electrically-conductive feature penetrating through the dielectric core, wherein the first electrically-conductive feature is electrically floating.

6. The package of claim 5, wherein the antenna substrate further comprises:

a second electrically-conductive feature overlying and contacting the first electrically-conductive feature; and a third electrically-conductive feature underlying and contacting the first electrically-conductive feature.

7. The package of claim 1, wherein the first portion of the antenna comprises:

a top part in the first dielectric layer, wherein the top part is electrically conductive.

8. The package of claim 7, wherein the first portion of the antenna further comprises:

a bottom part in the second dielectric layer, wherein the bottom part is electrically conductive.

9. The package of claim 1, wherein the device die comprises a Radio-Frequency Integrated Circuit (RFIC) die, and wherein the RFIC die is electrically coupled to the antenna.

10. The package of claim 1, wherein the encapsulant comprises:

a first part between the first portion and the second portion of the antenna; and a second part higher than a bottom surface of the antenna substrate, wherein the first part and the second part of the encapsulant are formed of a same material, and the first part is continuously joined to the second part.

11. A package comprising:

a molding compound comprising a first edge;

a device die in the molding compound;

a redistribution structure underlying and electrically coupling to the device die, wherein the redistribution structure comprises:

a plurality of dielectric layers comprising second edges vertically aligned to the first edge; and a plurality of redistribution lines comprising some portions in the plurality of dielectric layers, wherein the redistribution structure comprises a first part of an antenna; and an antenna substrate over a part of the molding compound, wherein a third edge of the antenna substrate is vertically misaligned from the first edge and the second edges, and wherein the antenna substrate comprises a second part of the antenna.

12. The package of claim 11, wherein the antenna substrate comprises:

a dielectric core, wherein the second part of the antenna is in contact with one of a top surface and a bottom surface of the dielectric core.

13. The package of claim 12, wherein the antenna substrate further comprises:

a first dielectric mask layer over the dielectric core; and a second dielectric mask layer underlying the dielectric core, wherein edges of the first dielectric mask layer, the second dielectric mask layer, and the dielectric core are vertically aligned, and form the third edge of the antenna substrate.

14. The package of claim 13, wherein the edges of the first dielectric mask layer, the second dielectric mask layer, and the dielectric core are in contact with the molding compound to form a vertical interface.

15. The package of claim 11, wherein the redistribution structure comprises:

a feed line of the antenna; and a reflector of the antenna.

16. The package of claim 11 further comprising a thermal dissipation path in the antenna substrate, wherein the thermal dissipation path is electrically conductive, and is electrically floating.

17. A package comprising:

a molding compound;

a device die in the molding compound;

an antenna substrate over a first portion of the molding compound, the antenna substrate comprising:

a dielectric plate;

a first metal layer over the dielectric plate; and a second metal layer under the dielectric plate;

an antenna comprising:

a first part in one of the first metal layer and the second metal layer; and a second part underlying the molding compound; and a solder region electrically coupling to the antenna substrate and the device die, wherein the solder region comprises a part in the molding compound.

18. The package of claim 17, wherein the molding compound further comprises a second portion forming a vertical interface with the antenna substrate.

19. The package of claim 17 further comprising a dielectric layer underlying the device die, wherein the second part of the antenna is in the dielectric layer, and wherein the dielectric layer comprises a first edge flush with a second edge of the molding compound.

20. The package of claim 17, wherein the antenna substrate extends laterally beyond the device die.

* * * * *